(12) United States Patent
Sawada

(10) Patent No.: US 8,988,132 B2
(45) Date of Patent: Mar. 24, 2015

(54) SEMICONDUCTOR DEVICE

(75) Inventor: Kenichi Sawada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 249 days.

(21) Appl. No.: 13/497,392

(22) PCT Filed: Feb. 23, 2011

(86) PCT No.: PCT/JP2011/054005
§ 371 (c)(1),
(2), (4) Date: Mar. 21, 2012

(87) PCT Pub. No.: WO2011/118321
PCT Pub. Date: Sep. 29, 2011

(65) Prior Publication Data
US 2012/0223763 A1    Sep. 6, 2012

(30) Foreign Application Priority Data

Mar. 23, 2010  (JP) ................................. 2010-066708

(51) Int. Cl.
*H03K 17/687* (2006.01)
*H01L 27/02* (2006.01)
(Continued)

(52) U.S. Cl.
CPC ........ *H01L 27/0285* (2013.01); *H01L 21/8213* (2013.01); *H01L 25/072* (2013.01); *H01L 25/18* (2013.01); *H02M 1/08* (2013.01); *Y02B 70/1483* (2013.01); *H01L 2924/0002* (2013.01)
USPC .......................................... 327/430; 327/427

(58) Field of Classification Search
CPC . H03K 17/687; H03K 17/693; H03K 17/063; H03K 17/567; H03L 27/097
USPC .......... 327/427, 430, 434; 323/224, 282, 284, 323/285, 351
See application file for complete search history.

(56) References Cited

U.S. PATENT DOCUMENTS

| | | |
|---|---|---|
| 4,256,977 A | 3/1981 | Hendrickson |
| 4,677,324 A | 6/1987 | Ronan, Jr. et al. |

(Continued)

FOREIGN PATENT DOCUMENTS

| | | |
|---|---|---|
| JP | 2006-019174 | 7/2006 |
| JP | 2006-191747 | 7/2006 |

(Continued)

OTHER PUBLICATIONS

Office Action in Chinese Patent Application No. 201180002137.5, dated May 19, 2014.

(Continued)

*Primary Examiner* — Diana J Cheng
(74) *Attorney, Agent, or Firm* — Venable LLP; Steven J. Schwarz; Tamatane J. Aga

(57) ABSTRACT

Provided is a semiconductor device which avoids an adverse effect of high temperatures due to a switching element and in which a circuit to prevent false firing is arranged on the same substrate as the switching element. An N-channel type MOSFET 10 and a JFET 30 of an N-channel type containing a semiconductor material of silicon carbide are individually arranged in proximity on conductive patterns 51, 52 on a substrate 5, and a gate electrode 13 of the MOSFET 10 and a drain electrode 31 of the JFET 30 are connected by a lead 61. When an external drive signal for on/off control of MOSFET 10 propagates between source electrode 32 and drain electrode 31 of JFET 30, the channel resistance of JFET 30 is changed to a large/small value according to a low/high level of gate voltage between source electrode 32 and gate electrode 33, whereby a leading edge of a switching waveform between drain electrode 11 and source electrode 12 of MOSFET 10 comes to have a gentler slope than a trailing edge thereof.

13 Claims, 12 Drawing Sheets

(51) Int. Cl.
*H01L 21/82* (2006.01)
*H01L 25/07* (2006.01)
*H01L 25/18* (2006.01)
*H02M 1/08* (2006.01)

(56) References Cited

U.S. PATENT DOCUMENTS

| | | | |
|---|---|---|---|
| 5,005,061 | A | 4/1991 | Robb et al. |
| 5,378,642 | A * | 1/1995 | Brown et al. ............... 438/186 |
| 2005/0146934 | A1 | 7/2005 | Forbes et al. |
| 2006/0087349 | A1 | 4/2006 | Bird et al. |
| 2007/0221994 | A1 | 9/2007 | Ishikawa et al. |
| 2007/0290212 | A1 | 12/2007 | Mazzola |
| 2008/0205100 | A1 * | 8/2008 | Sakamoto ....................... 363/67 |
| 2009/0195068 | A1 | 8/2009 | Ohashi et al. |

FOREIGN PATENT DOCUMENTS

| | | |
|---|---|---|
| JP | 2007-259576 | 10/2007 |
| JP | 2009-022106 | 1/2009 |

OTHER PUBLICATIONS

Extended European Search Report issued in European Patent Application No. 11759129.7 dated Aug. 22, 2014.

* cited by examiner

Fig.5

| SEMICONDUCTOR ELEMENT / SWITCHING ELEMENT / DRIVE SIGNAL | | N-CHANNEL MOSFET | | P-CHANNEL MOSFET | |
|---|---|---|---|---|---|
| | | ON | OFF | ON | OFF |
| N-CHANNEL JFET | ⎍ H | NEGATIVE VOLTAGE LOW | | | ZERO VOLTAGE HIGH |
| | ⎎ L | | HIGH ZERO VOLTAGE | LOW NEGATIVE VOLTAGE | |
| P-CHANNEL JFET | ⎍ H | POSITIVE VOLTAGE HIGH | | | ZERO VOLTAGE LOW |
| | ⎎ L | | LOW ZERO VOLTAGE | HIGH POSITIVE VOLTAGE | |

SEMICONDUCTOR DEVICE

TECHNICAL FIELD

The present invention relates to a semiconductor device with an insulated gate type switching element and a semiconductor circuit on a substrate.

BACKGROUND ART

In recent years, a DC/DC converter is widely used in electronic equipment necessitating a stabilized DC power supply. In a step-down DC/DC converter, a primary DC voltage is switched on/off by a switching element, and pulses generated thereby are smoothed by an LC filter to obtain a stabilized voltage. An electric current flowing back during off periods of the switching element is made to flow to a second switching element in place of a diode, to constitute a synchronous DC/DC converter, thereby increasing utilization efficiency of the power supply.

Incidentally, when in the synchronous DC/DC converter the first switching element to implement switching of the primary DC voltage is turned on, the terminal voltage of the second switching element can suddenly increase to increase the voltage of the control electrode because of influence of a parasitic capacitance, thereby leading to false firing (self-turn-on) of the second switching element.

FIG. 12 is a circuit diagram showing a drive circuit of a conventional switching element. The technology used for the aforementioned false firing is, for example as shown in FIG. 12, such that a circuit in which a resistor R9 to decrease the turn-on speed of the first switching element 10a, and a Schottky barrier diode (SBD) D2a to keep the turn-off speed are connected in parallel is connected in series to a control electrode 13a of the first switching element. It is common practice to construct the parallel circuit using a resistance unit consisting of a typical resistor, and an SBD constituted by silicon. It is needless to mention that, for increase in speed of switching, it is desirable to make the wiring length for the circuit connected to the control electrode as short as possible and thereby to decrease inductance.

Furthermore, Patent Literature 1 discloses the technology of preventing the false firing of the second switching element, by generating a negative voltage by a drive circuit of a signal to drive the second switching element and applying the negative voltage to the control electrode during the off periods of the second switching element.

CITATION LIST

Patent Literature

Patent Literature 1: Japanese Patent Application Laid-open No. 2009-22106

SUMMARY OF INVENTION

Technical Problem

In the method using the parallel circuit of the resistor and SBD as described above, however, the resistor and silicon could deteriorate in high-temperature environments and therefore the parallel circuit cannot be arranged on the same substrate as the first switching element if the circuit can become hot with switching, thus posing the problem that the wiring length from the drive circuit to the control electrode becomes so long as to make influence of inductance unignorable. In addition to this problem, the technology disclosed in Patent Literature 1 had the problem that the drive circuit of the switching element became complicated.

The present invention has been accomplished in view of the above-described circumstances and it is an object of the present invention to provide a semiconductor device which avoids the adverse effect of high temperatures due to the switching element and in which a circuit to prevent the false firing is arranged on the same substrate as the switching element.

Solution to Problem

A semiconductor device according to the present invention is a semiconductor device comprising an insulated gate type switching element and a semiconductor circuit; and a control signal for on/off control of the switching element propagating in the semiconductor circuit, the switching element and the semiconductor circuit being provided on a substrate, the semiconductor circuit comprising a semiconductor element or a plurality of semiconductor elements, the semiconductor element and the plurality of semiconductor elements containing a semiconductor with a larger bandgap than silicon, and the semiconductor element and the plurality of semiconductor elements being configured so that resistance upon propagation of the control signal can be varied to a large/small value.

According to the present invention, a gate current upon on/off control of the switching element may be changed to a small/large level by making the large/small value of resistance variable in propagation of the control signal in the semiconductor element, whereby a leading edge of a switching waveform in the switching element comes to have a gentler slope than a trailing edge thereof. Since the semiconductor element is constituted by the wide bandgap semiconductor, the semiconductor element securely operates without deterioration even with increase in temperature of the semiconductor element as closely subjected to influence of heat generated by the switching element arranged on the same substrate.

In the semiconductor device according to the present invention, the semiconductor element is an FET of an N-channel type (or a P-channel type), and resistance of a channel of the semiconductor element varies to a large/small value according to a low/high level (or a high/low level) of voltage of a gate electrode with reference to a potential of a drain electrode or a source electrode.

In the present invention, since the drain and source of the N-channel type (or the P-channel type) FET have approximate symmetry, when the voltage of the gate electrode with reference to the potential of the source electrode or the drain electrode of the FET fed with the control signal for on/off control of the switching element is changed to the low/high level (or the high/low level), the channel resistance of the FET upon the on/off control of the switching element may be changed to the large/small value.

In the semiconductor device according to the present invention, the FET is a JFET or a depletion type MOSFET.

In the present invention, since the FET is the ET or the depletion type MOSFET, the channel becomes conducting even with no bias voltage given between the source electrode and gate electrode of the FET. Therefore, a configuration of a drive circuit for the FET becomes simple.

In the semiconductor device according to the present invention, the switching element is of an N-channel type (or a P-channel type), the semiconductor elements are Schottky barrier diodes connected in antiparallel connection, and resistance in a forward direction (or a backward direction) to the switching element is set larger than resistance in a backward direction (or a forward direction) to the switching element.

In the present invention, since the switching element is of the N-channel (or P-channel) type, the gate current upon on/off control of the switching element flows in the forward/backward direction (or backward/forward direction) to the switching element. The Schottky barrier diodes used as the semiconductor elements are connected in antiparallel connection and the forward resistance of the semiconductor element to the switching element becomes larger (or smaller) than the backward resistance. Therefore, the gate current upon the on/off control of the switching element may be changed to the small/large level by the resistances of the Schottky barrier diodes.

In the semiconductor device according to the present invention, the semiconductor element and the plurality of semiconductor elements contain a semiconductor material of silicon carbide.

In the present invention, since the semiconductor element contains silicon carbide, secure operation is expected even if the temperature of the semiconductor element increases to around 400° C.

A semiconductor device according to the present invention comprises: an insulated gate type switching element being provided on a substrate; and a semiconductor circuit having at least one semiconductor element, the semiconductor element containing a semiconductor material with a larger bandgap than silicon and being provided on the substrate, the semiconductor circuit receiving a drive signal at an input of the semiconductor circuit and generating a signal to control conduction/non-conduction of the switching element at an output of the semiconductor circuit, the drive signal having a high level and a low level, the drive signal including a first transition from one to the other between the high level and the low level, and a second inverse transition between the high level and the low level, the drive signal propagating from the input of the semiconductor circuit to the output of the semiconductor circuit through the semiconductor element, and in the semiconductor circuit, the semiconductor element changing from a first to a second of two conduction states in response to the first transition of the drive signal in propagation of the drive signal in the semiconductor element and the semiconductor element changing from the second to the first of the conduction states in response to the second transition of the drive signal in propagation of the drive signal in the semiconductor element, so that the semiconductor circuit has variable resistance of the semiconductor circuit to the propagation of the drive signal, whereby the signal results at the output of the semiconductor circuit according to variation in the resistance. According to this semiconductor device, the resistance of the semiconductor circuit to the propagation of the drive signal becomes variable according to the transition of the level of the drive signal. Therefore, the resistance of the semiconductor circuit to the propagation of the drive signal may be adjusted according to the transition of the level of the drive signal and therefore a leading edge of a waveform of the signal generated by the drive signal so as to control the conduction/non-conduction of the switching element may have a gentler slope than a trailing edge thereof. Since the semiconductor element has the wide bandgap semiconductor material, the semiconductor element securely operates without deterioration even if the temperature of the semiconductor element increases as closely subjected to influence of heat generated by the switching element arranged on the same substrate.

The semiconductor device according to the present invention may be configured as follows: the semiconductor element has a gate electrode, a drain electrode, and a source electrode, the semiconductor circuit has another input to receive a gate signal for the gate electrode of the semiconductor element, the semiconductor element is an FET, the FET is of one of an N-channel type and a P-channel type, and in the FET, resistance of a channel of the semiconductor element varies according to the gate signal with reference to a potential of one of the drain electrode and the source electrode. In this manner, the FET may be used as the semiconductor element of the semiconductor circuit.

In the semiconductor device according to the present invention, the semiconductor element may be of a type different from an insulated gate type. Therefore, the semiconductor element and the switching element may be provided as semiconductor chips different from each other.

The semiconductor device according to the present invention may be configured as follows: the FET is a JFET, and the drive signal propagates from one of a source electrode and a drain electrode of the JFET to the other of the source electrode and the drain electrode of the JFET. In this manner, the JFET may be used as the semiconductor element of the semiconductor circuit.

The semiconductor device according to the present invention may be configured as follows: the FET is a depletion type MOSFET, and the drive signal propagates from one of a source electrode and a drain electrode of the MOSFET to the other of the source electrode and the drain electrode of the MOSFET. Therefore, the MOSFET may also be used as the semiconductor element of the semiconductor circuit.

The semiconductor device according to the present invention may be configured as follows: the semiconductor circuit further has another semiconductor element, and is constituted by a parallel circuit, in the parallel circuit, the semiconductor element and the other semiconductor element are connected in parallel, the semiconductor element and the other semiconductor element are first and second Schottky barrier diodes, respectively, the first and second Schottky barrier diodes are connected in directions opposite to each other and in parallel with each other, the drive signal propagates from an input of the parallel circuit to an output of the parallel circuit, and when the first Schottky barrier diode is connected in a forward direction to the switching element and the second Schottky barrier diode is connected in a backward direction to the switching element, resistance of the first Schottky barrier diode is larger than resistance of the second Schottky barrier diode. Therefore, the semiconductor circuit may be simply configured using the two Schottky barrier diodes.

A semiconductor device according to the present invention comprises: an insulated gate type switching element being provided on a substrate; and a semiconductor circuit having one semiconductor element, the semiconductor element containing a semiconductor material with a larger bandgap than silicon and being provided on the substrate, the semiconductor element having a source electrode, a drain electrode, and a gate electrode, one of the source electrode and the drain electrode of the semiconductor element receiving a drive signal, the drive signal having a high level and a low level, the drive signal propagating from an input of the semiconductor circuit to an output of the semiconductor circuit through the semiconductor element, and the other of the source electrode and the drain electrode of the semiconductor element providing a signal to control conduction/non-conduction of the switching element according to the drive signal. In this semiconductor device, the resistance of the semiconductor circuit to the propagation of the drive signal is variable according to the transition of the level of the drive signal received by one of the source electrode and the drain electrode of the semiconductor element. Since the resistance of the semiconductor circuit to the propagation of the drive signal may be adjusted according to the transition of the level of the drive signal in this manner, a leading edge of a waveform of the signal generated by the drive signal so as to control the conduction/non-conduction of the switching element may have a gentler slope than a trailing edge thereof. Since the semiconductor element has the wide bandgap semiconductor material, the semiconductor element securely operates without deterioration even if the temperature of the semiconductor element increases as closely subjected to influence of heat generated by the switching element arranged on the same substrate.

A semiconductor device according to the present invention comprises: an insulated gate type switching element being provided on a substrate; and a semiconductor circuit having two semiconductor elements, the two semiconductor elements containing a semiconductor material with a larger bandgap than silicon and being provided on the substrate, the two semiconductor elements being first and second Schottky barrier diodes, respectively, the first and second Schottky barrier diodes constituting a parallel circuit, the first and second Schottky barrier diodes being connected in directions opposite to each other and in parallel with each other in the parallel circuit, the first Schottky barrier diode being connected in a forward direction to the switching element, the second Schottky barrier diode being connected in a backward direction to the switching element, resistance of the first Schottky barrier diode being larger than resistance of the second Schottky barrier diode, the semiconductor circuit receiving a drive signal at an input thereof, the drive signal having a high level and a low level, the drive signal propagating from the input of the semiconductor circuit to an output of the semiconductor circuit through the parallel circuit, and the output of the semiconductor circuit providing a signal to control conduction/non-conduction of the switching element according to the drive signal. In this semiconductor device, since the first Schottky barrier diode connected in the forward direction has the larger resistance than the second Schottky barrier diode connected in the backward direction, the resistance of the semiconductor circuit to the propagation of the drive signal becomes variable according to the transition of the level of the drive signal. Since the resistance of the semiconductor circuit to the propagation of the drive signal may be adjusted according to the transition of the level of the drive signal in this manner, a leading edge of a waveform of the signal generated by the drive signal so as to control the conduction/non-conduction of the switching element may have a gentler slope than a trailing edge thereof. Since the semiconductor element has the wide bandgap semiconductor material, the semiconductor element securely operates without deterioration even if the temperature of the semiconductor element increases as closely subjected to influence of heat generated by the switching element arranged on the same substrate.

In the present invention, the switching element may be of one of an N-channel type and a P-channel type, thereby permitting either one of the N-channel type and the P-channel type to be used; furthermore, in the semiconductor device, a semiconductor material of the semiconductor element may contain silicon carbide, thus providing the wide bandgap semiconductor element.

Advantageous Effects of Invention

According to the present invention, since the gate current upon the on/off control of the switching element may be changed to the small/large level by making the resistance variable upon the propagation of the control signal in the semiconductor element constituted by the wide bandgap semiconductor, the leading edge of the switching waveform in the switching element has the gentler slope than the trailing edge thereof. Even in the case where the temperature of the semiconductor element increases as closely subjected to influence of heat generated by the switching element arranged on the same substrate, the semiconductor element securely operates without deterioration. Therefore, it becomes feasible to avoid the adverse effect of high temperatures due to the switching element and to arrange the circuit to prevent the false firing, on the same substrate as the switching element.

BRIEF DESCRIPTION OF DRAWINGS

FIG. 5 is a graph to illustrate gate voltages of JFETs upon on/off control of MOSFETs by a drive signal propagating in a channel of JFETs.

DESCRIPTION OF EMBODIMENTS

The present invention will be detailed below on the basis of the drawings showing embodiments thereof. It is, however, noted that the embodiments below illustrate semiconductor devices for materialization of the present invention and the present invention is by no means limited to the devices described below as semiconductor devices thereof. Furthermore, this description does not restrict the members as set forth in the scope of claims to the members described in the embodiments.

Embodiment 1

Figure 1:
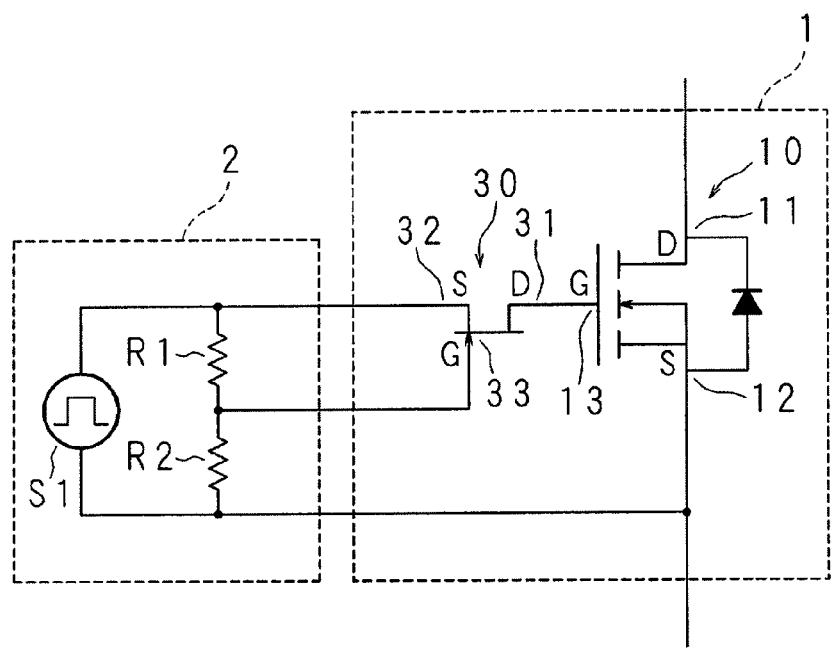
FIG. 1 is a circuit diagram of a semiconductor device according to Embodiment 1 of the present invention.

FIG. 1 is a circuit diagram of a semiconductor device according to Embodiment 1 of the present invention. In the drawing reference sign 1 designates the semiconductor device, and the semiconductor device 1 is provided with an N-channel type MOSFET 10 as a switching element which is constituted by a so-called wide bandgap semiconductor such as silicon carbide, or a semiconductor material of silicon, and an N-channel type JFET 30 as a semiconductor element which is constituted by a semiconductor material of silicon carbide and a drain electrode 31 of which is connected to a gate electrode 13 of MOSFET 10. A drive signal for turning MOSFET 10 on/off is supplied from an external drive circuit 2 to between a source electrode 32 of JFET 30 and a source electrode 12 of MOSFET 10. An external load and an external power supply not shown are connected to a drain electrode 11 and a source electrode 12 of MOSFET 10.

The drive circuit 2 is provided with a signal source S1 which supplies the drive signal to between the source electrode 32 and the source electrode 12, and a series circuit of resistors R1, R2 which divides the voltage output from the signal source S1. A connection point of resistors R1, R2 and the other end of resistor R1 are connected to a gate electrode 33 and the source electrode 32 of JFET 30, respectively.

In the above-described configuration, when the drive signal output from the signal source S1 is an H (high) level, the H level voltage is divided by the resistors R1, R2 and a divided voltage to the resistor R1 is applied between the gate electrode 33 and the source electrode 32. As a consequence, the voltage of gate electrode 33 with reference to a potential of the source electrode 32 (which will be referred to hereinafter simply as gate voltage) becomes a negative voltage. On the other hand, when the drive signal output from the signal source S1 is an L (low) level, a divided voltage to the resistor R1 is approximately zero and thus the gate voltage is approximately zero.

Figure 2:
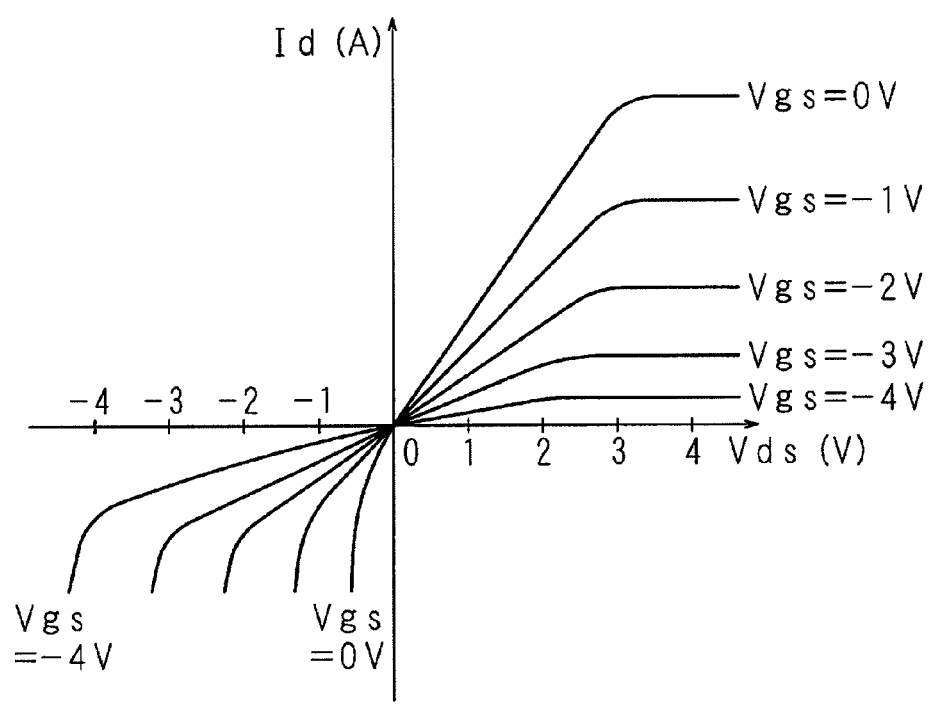
FIG. 2 is an explanatory drawing schematically showing states of change in channel resistance of a typical N-channel type JFET in accordance with gate voltage.

The below will describe a relation of gate voltage and channel resistance of JFET 30. FIG. 2 is an explanatory drawing schematically showing states of change in channel resistance of a typical N-channel type JFET in accordance with gate voltage. In the drawing the horizontal axis represents voltage of the drain electrode with reference to the potential of the source electrode (which will be referred to hereinafter simply as drain voltage) Vds (V) and the vertical axis electric current flowing into the drain electrode (which will be referred to hereinafter simply as drain current) Id (A). In FIG. 2, changes of drain current Id against drain voltage Vds are indicated by solid lines, using five levels of gate voltage Vgs (0 V, −1 V, −2 V, −3 V, and −4 V) as parameter. The inverse of gradient of each curve corresponds to the channel resistance. Since the source electrode and drain electrode of JFET have approximate symmetry, curves similar to those in FIG. 2 are also obtained in a case where the horizontal axis represents the voltage of the source electrode with reference to the potential of the drain electrode and the vertical axis the electric current flowing into the source electrode, using voltages of the gate electrode with reference to the potential of the drain electrode as parameter.

As shown in FIG. 2, it is seen that when the gate voltage Vgs is changed with the drain voltage Vds being kept at a constant positive voltage, the drain current Id varies to a small/large level according to a low/high level of the gate voltage Vgs, so as to lead to change in channel resistance to a large/small level. When the gate voltage Vgs is fixed, the channel resistance is approximately constant and the drain current Id nearly proportional to the drain voltage Vds flows. It is, however, noted that in a so-called saturation region, the drain current Id becomes approximately constant. On the other hand, as the drain voltage Vds is gradually decreased in the negative voltage range, the gate electrode and the drain electrode become conducting with the drain voltage Vds becoming smaller than the gate voltage Vgs, to cause the gate current to flow out from the drain electrode, thus resulting in sudden increase of negative drain current. This phenomenon tends to occur in the region where the absolute value of the negative gate voltage Vgs is small. The semiconductor element does not have to be limited to JFET but may be a depletion type MOSFET. When the semiconductor element is a depletion type MOSFET, even if the drain voltage Vds becomes lower than the gate voltage Vgs, the gate electrode and the drain electrode do not become conducting and there is no sudden increase of the negative drain current Id with the drain voltage Vds being negative.

Referring back to FIG. 1, when the drive signal output from the signal source S1 turns from the L (low) level to the H (high) level so as to decrease the gate voltage Vgs of JFET 30 to a negative voltage, the channel resistance of JFET 30 varies from a small value to a large value with reference to the description of FIG. 2. This allows the MOSFET 10 to be gently turned on with control over the gate current flowing to the gate electrode 13, whereby a leading edge of a switching waveform (a decaying edge in the present Embodiment 1) between drain electrode 11 and source electrode 12 comes to have a gentle slope. In this case, the potential of the source electrode 32 quickly rises to the H level, while at the drain electrode 31 connected to the gate electrode 13 of MOSFET 10, a rise of potential lags because of influence of a stray capacitance of the gate electrode 13, with the result that the drain voltage Vds of JFET 30 becomes a negative voltage. However, when the channel resistance of JFET 30 is changed from the small value to the large value, the absolute value of the negative gate voltage Vgs is kept sufficiently large and therefore an inversion phenomenon in which the drain voltage Vds of JFET 30 becomes lower than the gate voltage Vgs is unlikely to occur. Even if such inversion phenomenon occurs, the potential of the gate electrode 13 will rise because of the electric current flowing out from the drain electrode 31 of JFET 30, so as to quickly dissolve the aforementioned inversion phenomenon.

Next, when the drive signal output from the signal source S1 turns from the H level to the L level, and then the gate voltage Vgs of JFET 30 rises from the negative voltage to nearly zero, the channel resistance of JFET 30 varies from the large value to the small value with reference to the description of FIG. 2. This allows the gate current to be extracted from the gate electrode 13 by low resistance so as to quickly turn the MOSFET 10 off, and a trailing edge of the switching waveform between drain electrode 11 and source electrode 12 (a rising edge in the present Embodiment 1) comes to have a steep slope. In this case, the potential of source electrode 32 quickly decays to the L level, whereas at the drain electrode 31 connected to the gate electrode 13 of MOSFET 10, a decay of potential slightly lags because of influence of the stray capacitance of gate electrode 13, with the result that the drain voltage Vds of JFET 30 becomes a positive voltage, without occurrence of the aforementioned inversion phenomenon.

Figure 3:
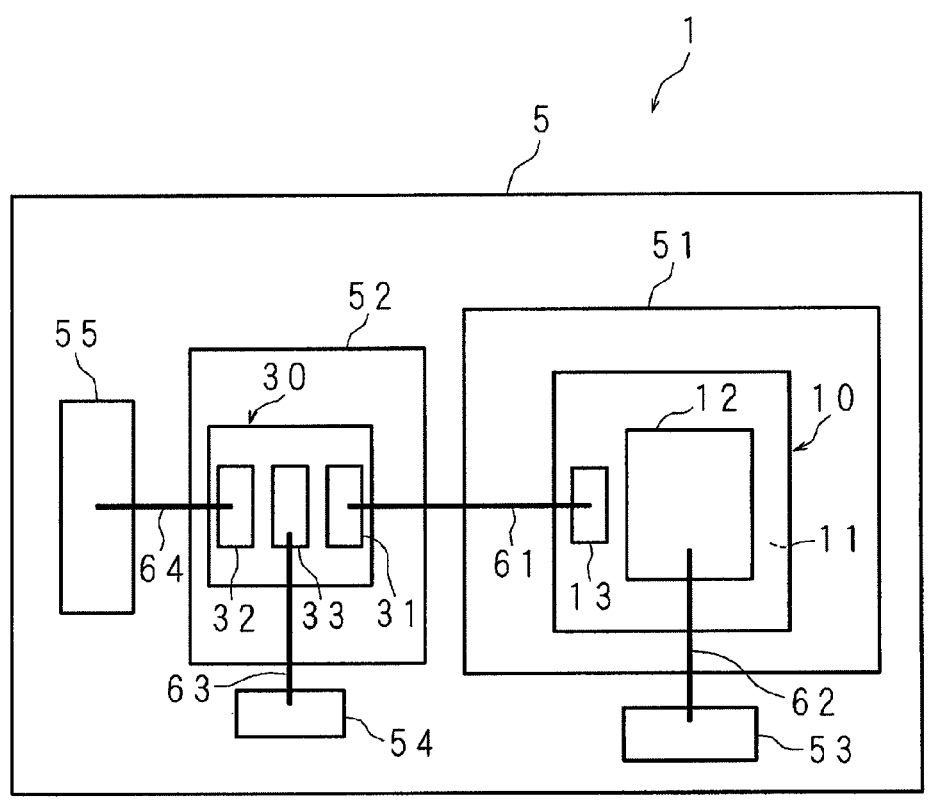
FIG. 3 is a schematic plan view of the semiconductor device.

The below will describe a mounting example of the semiconductor device 1 wherein the MOSFET 10 and JFET 30 are mounted on an identical substrate. FIG. 3 is a schematic plan view of the semiconductor device 1. The semiconductor device 1 is provided with a substrate 5 of a ceramic material, and the vertical MOSFET 10 and lateral JFET 30 are individually arranged in proximity on conductive patterns 51, 52 on the substrate 5. The drain electrode 11 of MOSFET 10 and the conductive pattern 51, and a substrate of JFET 30 and the conductive pattern 52, are connected each with a high-temperature solder and/or with an electroconductive adhesive. The gate electrode 13 and the drain electrode 31 are connected by a lead 61, and the source electrode 12, gate electrode 33, and source electrode 32 are individually connected to respective conductive patterns 53, 54, and 55 on the substrate 5 by leads 62, 63, and 64, respectively. The JFET 30 may be a vertical type, and in the case of the vertical type, the drain electrode 31 directed toward the substrate 5, and the conductive pattern 52 are connected with a high-temperature solder and the gate electrode 13 and the conductive pattern 52 are connected by the lead 61.

In FIG. 3, since the JFET 30 is arranged in proximity to the MOSFET 10, it is closely subjected to influence of heat generated by switching of MOSFET 10, but the semiconductor material thereof is silicon carbide to resist deterioration even at high temperatures of about 400° C., ensuring secure operation as FET.

In the present Embodiment 1 as described above, the large/small level of channel resistance is made variable upon propagation of the MOSFET drive signal through the JFET, so as to allow the change of the gate current to the small/large level upon on/off control of the MOSFET, whereby the leading edge of the switching waveform between the drain electrode and the source electrode of MOSFET comes to have the gentler slope than the trailing edge thereof. Since the JFET is constituted by the wide bandgap semiconductor, the JFET securely operates without deterioration even if the temperature of JFET increases as closely subjected to influence of heat generated by the MOSFET arranged on the same substrate. Therefore, it becomes feasible to arrange the circuit for preventing false firing, on the same substrate as the switching element, while avoiding the adverse effect of high temperatures due to the switching element.

Since the semiconductor element is the JFET or the depletion type MOSFET, the channel becomes conducting even if no extra bias voltage is given as the gate voltage Vgs of FET. Therefore, it becomes feasible to readily configure the drive circuit of the FET.

Furthermore, since the JFET as the semiconductor element is constituted by silicon carbide, it may be securely operated as a variable resistive element even if the temperature of JFET increases to around 400° C.

Modification Example 1

Figure 4:
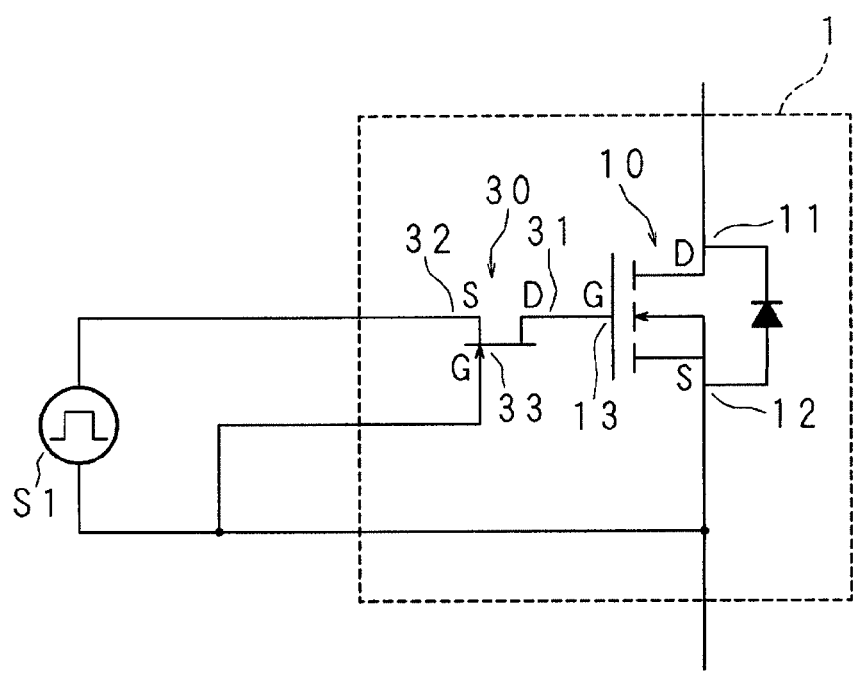
FIG. 4 is a circuit diagram of a modification example of the semiconductor device according to Embodiment 1 of the present invention.

In FIG. 1, the voltage of the drive signal output from the signal source S1 is divided by the voltage divider consisting of the resistors R1, R2 and the divided voltage to the resistor R1 is used as the gate voltage Vgs of JFET 30; however, the voltage divider may be omitted in the case where the voltage of the drive signal is adequately adjusted in accordance with the change characteristic of channel resistance against gate voltage Vgs of JFET 30. The below will describe a modification example without the voltage divider. FIG. 4 is a circuit diagram of the modification example of the semiconductor device 1 according to Embodiment 1 of the present invention. The drive signal output from the signal source S1 is supplied to between the source electrode 32 of JFET 30 and the source electrode 12 of MOSFET 10, which is the same as in FIG. 1, but the voltage of the drive signal is applied directly between the gate electrode 33 and the source electrode 32, which is different from FIG. 1. Since the circuit of the semiconductor device 1 is the same as in FIG. 1, the description thereof is omitted herein.

In the above-described configuration, when the drive signal output from the signal source S1 is the H level, the gate voltage Vgs of JFET 30 becomes a negative voltage the absolute value of which is equal to the voltage value of the H level. When the drive signal output from the signal source S1 is the L level, the gate voltage Vgs becomes approximately zero, which is the same as in FIG. 1. In this case, the crest value of the H level of the drive signal is adjusted in such a manner that the channel resistance of JFET 30 becomes a desired large value by the negative gate voltage Vgs with the drive signal from the signal source S1 turning to the H level. Conversely, the change characteristic of channel resistance against gate voltage Vgs of JFET 30 may be adjusted in accordance with the crest value of the H level of the drive signal. This adjustment allows omission of the resistors R1, R2 in the drive circuit 2.

Embodiment 2

Embodiment 1 is the mode wherein the channel types (N-channel type/P-channel type) of MOSFET 10 and JFET 30 both are the N-channel types, whereas Embodiment 2 is a mode wherein the channel types of MOSFET and JFET are made different from each other, and a mode wherein the both are the P-channel types.

FIG. 5 is a table to illustrate gate voltages of JFETs, with on/off states of MOSFETs by the drive signal propagating in the channel of JFETs. The same also applies to the case where the JFET is the depletion type MOSFET. In the table each row and each column represent the channel types of JFET and MOSFET, respectively. FIG. 5 shows the gate voltages applied when the MOSFET is turned on/off or off/on by the drive signal of the H/L level. FIG. 5 shows the example of gate voltages of JFETs with supply of the MOSFET drive signal to the source electrode of JFETs, and, since the source electrode and drain electrode of JFETs have approximate symmetry, a table similar to that in FIG. 5 is also obtained in an example to illustrate gate voltages (to the potential of the drain electrode) with supply of the MOSFET drive signal to the drain electrode.

For example, in the circuit diagrams of FIGS. 1 and 4 in Embodiment 1, when the N-channel type MOSFET 10 is turned on/off by the drive signal propagating in the channel of the N-channel type JFET 30, the gate voltage Vgs becomes the negative voltage with the drive signal at the H level and the gate voltage Vgs becomes the zero voltage with the drive signal at the L level. Namely, the channel resistance of JFET 30 is changed to the large/small value by changing the gate voltage Vgs to the low/high level, with respect to the drive signal of the H/L level for on/off control of the MOSFET 10. The below will describe a configuration of a combination of a P-channel type JFET and an N-channel type MOSFET, and a configuration of a combination of a P-channel type JFET and a P-channel type MOSFET. A circuit diagram of the configuration of the combination of N-channel type JFET and P-channel type MOSFET may be readily contemplated from circuit diagrams of configurations of other combinations, and therefore specific illustration thereof is omitted herein.

Figure 6:
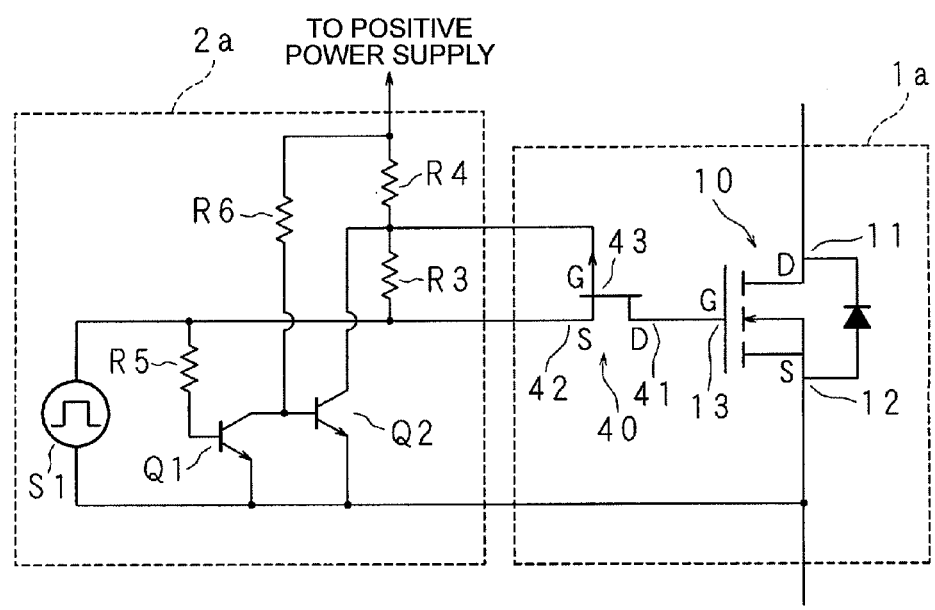
FIG. 6 is a circuit diagram of a semiconductor device according to Embodiment 2 of the present invention.

First described is the case of the combination of P-channel type JFET and N-channel type MOSFET. FIG. 6 is a circuit diagram of the semiconductor device according to Embodiment 2 of the present invention. In the drawing reference sign 1a designates the semiconductor device, and the semiconductor device 1a is provided with the N-channel type MOSFET 10, and a P-channel type JFET 40 which is constituted by the semiconductor material of silicon carbide and a drain electrode 41 of which is connected to the gate electrode 13 of MOSFET 10. A drive signal to turn the MOSFET 10 on/off is supplied from an external drive circuit 2a to between a source electrode 42 of JFET 40 and the source electrode 12 of MOSFET 10. An external load and an external power supply not shown are connected to the drain electrode 11 and the source electrode 12 of MOSFET 10.

The drive circuit 2a is provided with the signal source S1 to supply the drive signal to between the source electrode 42 and the source electrode 12, and a series circuit of resistors R3, R4 to divide a difference between voltage from an unrepresented positive power supply and the voltage output from the signal source S1. A connection point of the resistors R3, R4 and the other end of the resistor R3 are connected to a gate electrode 43 and the source electrode 42 of JFET 40, respectively. The voltage of the positive power supply is set higher than the voltage of the H level of the drive signal. The drive circuit 2a is further provided with an NPN type transistor Q1 whose base and emitter are connected through a resistor R5 as a base resistor to the signal source S1, and an NPN type transistor Q2 whose base and emitter are connected to a collector and the emitter of the transistor Q1, respectively. The collector of transistor Q1 is connected through a resistor R6 to the positive power supply, and the collector of transistor Q2 is connected to the gate electrode 43.

In the above-described configuration, an inverted signal resulting from inversion of the H/L level of the drive signal output from the signal source S1 is output at the collector of transistor Q1, and a signal of the H/L level resulting from inversion of the L/H level of the inverted signal is output at the collector of transistor Q2. Namely, when the drive signal output from the signal source S1 is the H level, the signal output from the collector of transistor Q2 is the H level (open collector). In this case, the difference between the voltage of the positive power supply and the voltage of the H level is divided by the resistors R3, R4 and the divided voltage to the resistor R3 is applied between the gate electrode 43 and the source electrode 42, whereby the gate voltage Vgs becomes a positive voltage. On the other hand, when the drive signal output from the signal source S1 is the L level, the collector of transistor Q2 becomes the L level and thus the source electrode 42 and the gate electrode 43 both are the L level, with the result that the gate voltage Vgs of HET 40 is approximately zero.

In other words, when the N-channel type MOSFET 10 is turned on/off by the drive signal propagating in the channel of the P-channel type JFET 40, the gate voltage Vgs of JFET 40 becomes the positive voltage with the drive signal at the H level, and the gate voltage Vgs becomes the zero voltage with the drive signal at the L level. Namely, as shown in FIG. 5, the channel resistance of JFET 40 may be changed to the large/small value by changing the gate voltage Vgs to the high/low level, with respect to the drive signal of the H/L level for on/off control of MOSFET 10.

Figure 7:
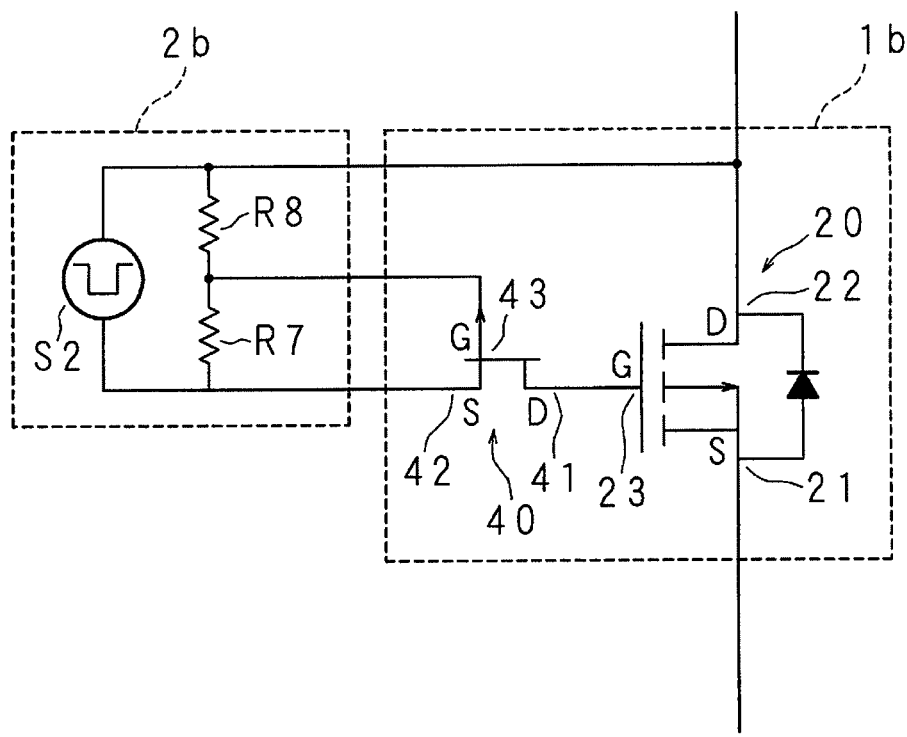
FIG. 7 is a circuit diagram of another semiconductor device according to Embodiment 2 of the present invention.

The following will describe the case of the combination of P-channel type JFET and P-channel type MOSFET. FIG. 7 is a circuit diagram of another semiconductor device according to Embodiment 2 of the present invention. In the drawing reference sign 1b designates the semiconductor device, and the semiconductor device 1b is provided with a P-channel type MOSFET 20, and the P-channel type JFET 40 which is constituted by the semiconductor material of silicon carbide and the drain electrode 41 of which is connected to a gate electrode 23 of MOSFET 20. A drive signal to turn the MOSFET 20 on/off is supplied from an external drive circuit 2b to between the source electrode 42 of JFET 40 and a drain electrode 22 of MOSFET 20. An external load and an external power supply not shown are connected to a source electrode 21 and the drain electrode 22 of MOSFET 20.

The drive circuit 2b is provided with a signal source S2 to supply the drive signal to between source electrode 42 and the drain electrode 22, and a series circuit of resistors R7, R8 to divide the voltage output from the signal source S2. A connection point of the resistors R7, R8 and the other end of the resistor R7 are connected to the gate electrode 43 and the source electrode 42 of JFET 40, respectively.

In the above-described configuration, when the drive signal output from the signal source S2 is the L level, the voltage of the L level is divided by the resistors R7, R8 and the divided voltage to the resistor R7 is applied between the gate electrode 43 and the source electrode 42, whereby the gate voltage Vgs becomes a positive voltage. On the other hand, when the drive signal output from the signal source S2 is the H level, since the divided voltage to the resistor R7 is approximately zero, the gate voltage Vgs is approximately zero.

In other words, when the P-channel type MOSFET 20 is turned on/off by the drive signal propagating in the channel of the P-channel type JFET 40, the gate voltage Vgs of JFET 40 becomes the positive voltage with the drive signal at the L level, and the gate voltage Vgs becomes the zero voltage with the drive signal at the H level. Namely, as shown in FIG. 5, the channel resistance of JFET 40 may be changed to the large/small value by changing the gate voltage Vgs to the high/low level, with respect to the drive signal of the L/H level for on/off control of MOSFET 20.

The other portions corresponding to those in Embodiment 1 are denoted by the same reference signs, and the detailed description thereof is omitted herein.

In the present Embodiment 2 as described above, since the drain and source of N-channel (or P-channel) type JFET have approximate symmetry, the FET channel resistance upon on/off control of MOSFET may be changed to the large/small value when the gate voltage with reference to the potential of the source electrode or drain electrode of JFET provided with the drive signal for on/off control of MOSFET is changed to the low/high (or high/low) level.

Embodiment 3

Figure 8:
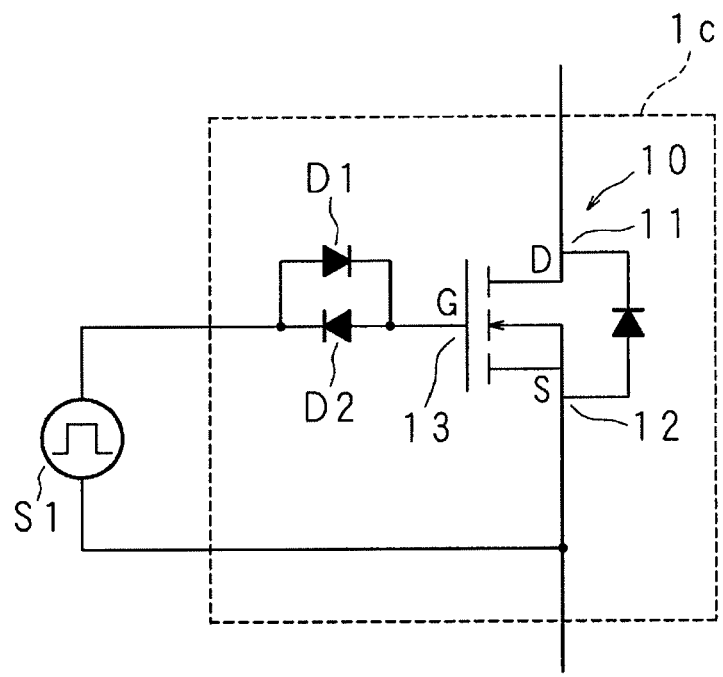
FIG. 8 is a circuit diagram of a semiconductor device according to Embodiment 3 of the present invention.

Embodiment 1 is the mode using the JFET 30 as semiconductor element, whereas Embodiment 3 is a mode using Schottky barrier diodes connected in antiparallel connection as semiconductor elements. FIG. 8 is a circuit diagram of a semiconductor device according to Embodiment 3 of the present invention. In the drawing reference sign 1c designates the semiconductor device, and the semiconductor device 1c is provided with the N-channel type MOSFET 10, and Schottky barrier diodes D1, D2 constituted by the semiconductor material of silicon carbide and connected in antiparallel connection. The Schottky barrier diodes D1, D2 have a cathode and an anode, respectively, connected to the gate electrode 13 of MOSFET 10. A drive signal to turn the MOSFET 10 on/off is supplied from the external signal source S1 to between an anode and a cathode of the respective Schottky barrier diodes D1, D2, and the source electrode 12 of MOSFET 10. An external load and an external power supply not shown are connected to the drain electrode 11 and the source electrode 12 of MOSFET 10.

In the above-described configuration, when the drive signal output from the signal source S1 turns from the L level to the H level, the Schottky barrier diode D1 with a relatively large on-resistance becomes conducting, whereby the gate current flowing to the gate electrode 13 is controlled to gently turn the MOSFET 10 on. When the drive signal output from the signal source S1 turns from the H level to the L level, the Schottky barrier diode D2 with a relatively small on-resistance becomes conducting, whereby the gate current is extracted from the gate electrode 13 by low resistance to quickly turn the MOSFET 10 off. In the case where the MOSFET 10 is the P-channel type, the same effect as above is achieved by setting the on-resistance of the Schottky barrier diode D1 relatively small and the on-resistance of the Schottky barrier diode D2 relatively large.

Figure 9:
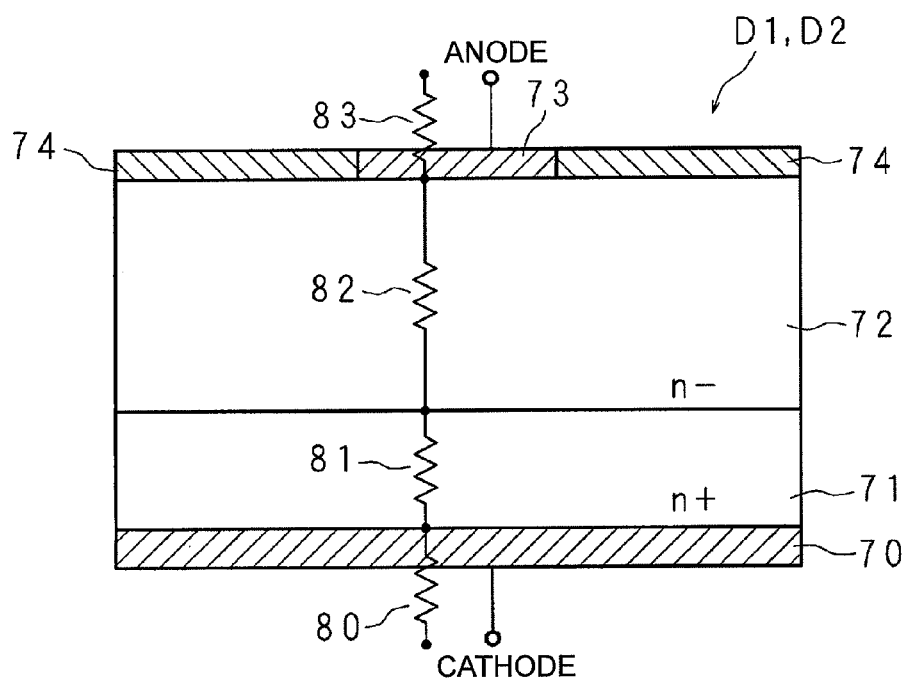
FIG. 9 is a vertical cross-sectional view schematically showing a configuration of Schottky barrier diodes.

The following will describe the on-resistances of Schottky barrier diodes D1, D2. FIG. 9 is a vertical cross-sectional view schematically showing the configuration of Schottky barrier diodes D1, D2. In the drawing reference numeral 71 designates an n+ type semiconductor layer, and an n− type semiconductor layer 72 is laid on a top surface of the n+ type semiconductor layer 71. A bottom surface of the n+ type semiconductor layer 71 is covered by a back metal electrode layer 70 serving as a cathode, and a metal electrode film 73 serving as an anode is formed in a central region on the top surface of the n− type semiconductor layer 72. The other region on the top surface of the n− type semiconductor layer 72 is covered by insulating film 74 constituted by silicon oxide.

The n+ type semiconductor layer 71 and the n− type semiconductor layer 72 have their respective equivalent resistances represented by n+ layer resistance 81 and n− layer resistance 82, for an on-state current to flow from the metal electrode film 73 to the back metal electrode layer 70. The back metal electrode layer 70 and the metal electrode film 73 have their respective equivalent resistances represented by back metal electrode layer resistance 80 and metal electrode film resistance 83. These equivalent resistances are considered to be on-resistances connected in series, for the on-state current. The on-resistances of Schottky barrier diodes D1, D2 may be resistances that may be varied by adjusting the resistivity and/or the thickness of the n− type semiconductor layer (referred to hereinafter as n− layer) 72 at the time of manufacture.

Figure 10:
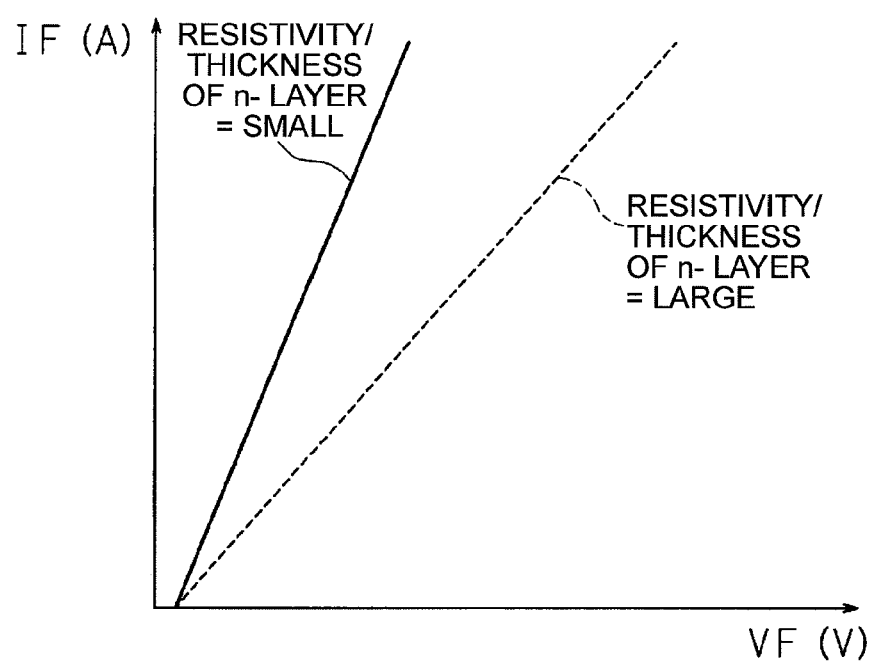
FIG. 10 is an explanatory diagram schematically showing states of change in on-resistance of Schottky barrier diodes according to resistivity and/or thickness of n− layer.

FIG. 10 is an explanatory diagram schematically showing states of change in the on-resistances of Schottky barrier diodes D1, D2 according to the resistivity and/or the thickness of n− layer 72. In the drawing the horizontal axis represents forward voltage VF (V) and the vertical axis forward current IF (A). In FIG. 10, a solid line indicates a case of resistivity and/or thickness of n− layer 72 being relatively small, and a dashed line a case of resistivity and/or thickness of n− layer 72 being relatively large. The inverses of gradients of the solid line and the dashed line correspond to on-resistances. Namely, it is seen that the gradient of forward current IF against forward voltage VF varies from a large value to a small value so as to change the on-resistance from a small value to a large value, according to change in resistivity and/or thickness of n− layer 72 from a small level to a large level.

Figure 11:
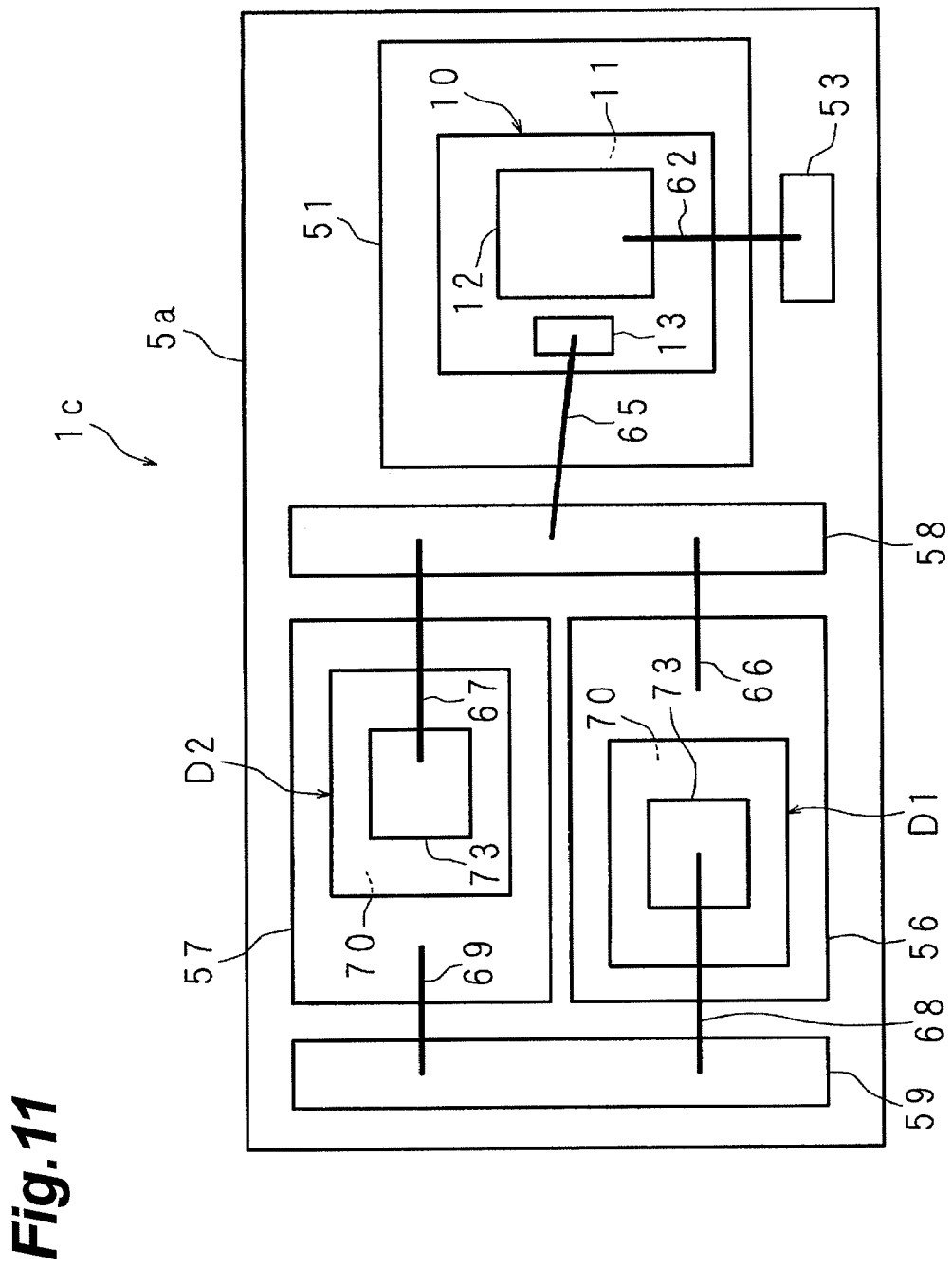
FIG. 11 is a schematic plan view of the semiconductor device.
Figure 12:
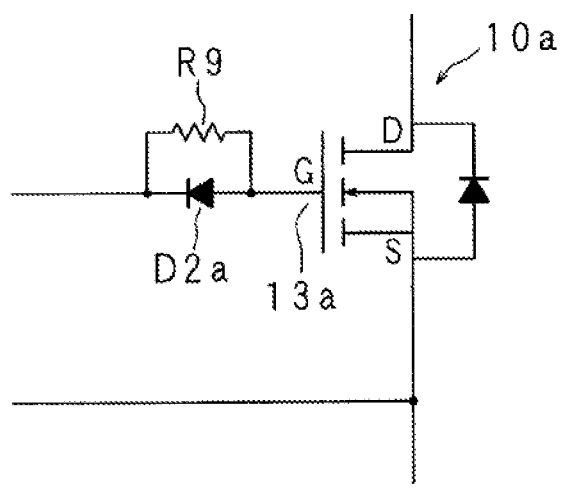
FIG. 12 is a circuit diagram showing a drive circuit of a conventional switching element.

The below will describe a mounting example of the semiconductor device 1c in which the MOSFET 10 and Schottky barrier diodes D1, D2 are mounted on an identical substrate. FIG. 11 is a schematic plan view of the semiconductor device 1c. The semiconductor device 1c is provided with a substrate 5a constituted by a ceramic material, and the vertical MOSFET 10 and Schottky barrier diodes D1, D2 are individually arranged in proximity on respective conductive patterns 51, 56, and 57 on the substrate 5a. The drain electrode 11 of MOSFET 10 and the conductive pattern 51, and the back metal electrode layers 70, 70 of Schottky barrier diodes D1, D2 and the conductive patterns 56, 57 are connected each with a high-temperature solder.

The source electrode 12 and the gate electrode 13 are connected to respective conductive patterns 53, 58 on the substrate 5a by leads 62, 65, respectively. The conductive patterns 56, 58 are connected by a lead 66, and the conductive pattern 58 and the metal electrode film 73 of Schottky barrier diode D2 are connected by a lead 67. The metal electrode film 73 of Schottky barrier diode D1 and conductive pattern 59 on the substrate 5a are connected by a lead 68, and the conductive patterns 57, 59 are connected by a lead 69.

Since the Schottky barrier diodes D1, D2 are arranged in proximity to the MOSFET 10, they are closely subjected to influence of heat generated by switching of MOSFET 10, but, because the Schottky barrier diodes D1, D2 are constituted by the semiconductor material of silicon carbide, they securely operate as diodes with different on-resistances, without risk of deterioration even at high temperatures of about 400° C.

The other portions corresponding to those in Embodiment 1 are denoted by the same reference signs, and the detailed description thereof is omitted herein.

According to the present Embodiment 3 as described above, since the MOSFET is of the N-channel (or P-channel) type, the gate current upon on/off control of MOSFET flows in the forward/backward direction (or in the backward/forward direction) to the MOSFET. Furthermore, the Schottky barrier diodes are connected in antiparallel connection and the forward resistance becomes larger (or smaller) than the backward resistance to the MOSFET. Therefore, the gate current upon on/off control of MOSFET may be changed to a small/large level by the resistances of the Schottky barrier diodes.

Embodiments 1 to 3 employed the MOSFET 10 or 20 as a switching element, but, the switching element does not have to be limited to this; it is also possible to employ a bipolar device with an insulated gate such as IGBT.

The above-described Embodiments 1, 2 will be described below using another expression. The semiconductor device 1 in Embodiment 1 will be described as an example, but the same also applies to the semiconductor devices 1a, 1b in Embodiment 2. As shown in FIG. 1, the semiconductor device 1 is provided with the MOSFET 10 and a semiconductor circuit. The MOSFET 10 is an insulated gate type semiconductor element provided on the substrate 5. The semiconductor circuit includes the JFET 30 as one semiconductor element. The JFET 30 contains a semiconductor material with a larger bandgap than silicon and is provided on the substrate 5. As shown in FIG. 5, this semiconductor circuit receives the drive signal having the H level (the high level) and the L level (the low level) at an input of this semiconductor circuit, and generates a signal to control the conduction/non-conduction state of the switching element at an output of this semiconductor circuit. As shown in FIG. 5, conduction represents the on state of MOSFET 10 and non-conduction the off state of MOSFET 10. The drive signal includes a first transition from one to the other between the H level and the L level, and a second inverse transition between the H level and the L level. For example, when the first transition is a transition from the H level to the L level, the second transition is a transition from the L level to the H level. The drive signal propagates from the input of the semiconductor circuit to the output of the semiconductor circuit, through the JFET 30. In the semiconductor circuit, as shown in FIG. 5, the JFET 30 changes from a first to a second of two conduction states in response to the first transition of the drive signal in propagation of the drive signal in JFET 30, and the JFET 30 changes from the second to the first of the two conduction states in response to the second transition of the drive signal in propagation of the drive signal in JFET 30, so that the semiconductor circuit has variable resistance of the semiconductor circuit to the propagation of the drive signal, whereby a signal to control conduction/non-conduction of the switching element according to this resistance change results at the output of the semiconductor circuit. The two conduction states of the semiconductor circuit are generated according to the resistance of the semiconductor circuit to the propagation of the drive signal. As shown in FIG. 5, when the MOSFET 10 turns to the on state, the resistance of the semiconductor circuit to the propagation of the drive signal is relatively large; when the switching element turns to the off state, the resistance of the semiconductor circuit to the propagation of the drive signal is relatively small.

The semiconductor circuit includes the N-channel type JFET 30, as shown in FIG. 1, but it may have the configuration including the P-channel type JFET 40, instead of the JFET 30, as shown in FIGS. 6 and 7. The semiconductor material of JFETs 30, 40 is silicon carbide. The semiconductor circuit includes the N-channel type MOSFET 10 as a switching element, as shown in FIG. 1, but it may have the configuration using the P-channel type MOSFET 20, instead of the MOSFET 10, as shown in FIG. 7.

The JFET 30, as shown in FIG. 1, has the gate electrode 33, drain electrode 31, and source electrode 32. The semiconductor circuit has another input to receive the gate signal (signal generated from the drive signal) for the gate electrode 33 of JFET 30. In the JFET 30, as shown in FIG. 2, the resistance of the channel of JFET 30 varies according to the level of the gate signal (one of Vgd and Vgs) with reference to the potential of either one of the drain electrode 31 and the source electrode 32. On the other hand, as shown in FIGS. 6 and 7, when the semiconductor element is of the P-channel type, this semiconductor element is JFET 40. The JFET 40 has the gate electrode 43, drain electrode 41, and source electrode 42. The semiconductor circuit has another input to receive the gate signal (signal generated from the drive signal) for the gate electrode 43 of JFET 40. In the HET 40, the resistance of the channel of JFET 40 varies according to the level of the gate signal (one of Vgd and Vgs) with reference to the potential of either one of the drain electrode 41 and the source electrode 42. In the case of the N-channel type JFET 30, as shown in FIG. 1, the drive signal propagates from one of the source electrode 32 and drain electrode 31 of JFET 30 to the other of the source electrode 32 and drain electrode 31 of JFET 30 and is subjected to voltage division, to be fed as a gate signal to the gate electrode 33. On the other hand, in the case of the P-channel type JFET 40, as shown in FIGS. 6 and 7, the drive signal propagates from one of the source electrode 42 and drain electrode 41 of JFET 40 to the other of the source electrode 42 and drain electrode 41 of JFET 40 and is subjected to voltage division, to be fed as a gate signal to the gate electrode 43. A depletion type MOSFET may be used instead of the insulated gate type JFET 30 and JFET 40. In this case, the drive signal propagates from one of the source electrode and drain electrode of the depletion type MOSFET to the other of the source electrode and the drain electrode of the depletion type MOSFET and is subjected to voltage division, to be fed as a gate signal to the gate electrode of the depletion type MOSFET.

Next, the action and effect will be further described, for example, in the case of Embodiment 1. When the drive signal output from the signal source S1 turns from the L level to the H level to decrease the gate voltage Vgs of JFET 30 to the negative voltage, the channel resistance of JFET 30 increases with reference to the description of FIG. 2. This allows the MOSFET 10 to be gently turned on by controlling the gate current flowing to the gate electrode 13 of MOSFET 10, whereby the leading edge of the switching waveform between the drain electrode 11 and source electrode 12 of MOSFET 10 comes to have a gentle slope. When the drive signal output from the signal source S1 turns from the H level to the L level, and thus the gate voltage Vgs of JFET 30 rises from the negative voltage to nearly zero, the channel resistance of JFET 30 decreases with reference to the description of FIG. 2. This allows the MOSFET 10 to be quickly turned off by extracting the gate current from the gate electrode 13 of MOSFET 10 by low resistance, whereby the trailing edge of the switching waveform between the drain electrode 11 and the source electrode 12 of MOSFET 10 comes to have a steep slope.

The configurations of Embodiments 1, 2 will be described using still another expression. For example, the semiconductor device 1 in Embodiment 1 shown in FIG. 1 will be described below, but the same also applies to the semiconductor devices 1a, 1b in Embodiment 2 shown in FIGS. 6 and 7. As shown in FIG. 1, the semiconductor device 1 is provided with the MOSFET 10 and a semiconductor circuit. The MOSFET 10 is an insulated gate type semiconductor element provided on the substrate 5. The semiconductor circuit has the JFET 30. The JFET 30 contains a semiconductor material with a larger bandgap than silicon, and is provided on the substrate 5. The JFET 30 has the source electrode 32, drain electrode 31, and gate electrode 33. One of the source electrode 32 and the drain electrode 31 of JFET 30 receives the drive signal having the H level (the high level) and the L level (the low level). The drive signal propagates from the input of the semiconductor circuit to the output of the semiconductor circuit through the JFET 30. The other of the source electrode 32 and the drain electrode 31 of JFET 30 provides a signal to control conduction/non-conduction of JFET 30 according to the drive signal. The JFET 30 shown in FIG. 1 is of the N-channel type, but it may have the configuration using the P-channel type JFET 40 in Embodiment 2 shown in FIGS. 6 and 7, instead of the JFET 30. It is also possible to adopt the configuration using the P-channel type MOSFET 20 in Embodiment 2 shown in FIG. 7, instead of the N-channel type MOSFET 10.

Next, Embodiment 3 described above will be explained using another expression. As shown in FIG. 8, the semiconductor device 1c is provided with the MOSFET 10 and a semiconductor circuit. The MOSFET 10 is an insulated gate type switching element provided on the substrate 5a. The semiconductor circuit has the Schottky barrier diodes D1, D2. The Schottky barrier diodes D1, D2 contain a semiconductor material with a larger bandgap than silicon, and are provided on the substrate 5a. The semiconductor circuit receives the drive signal having the H level (the high level) and the L level (the low level) at an input of the semiconductor circuit, and generates a signal to control conduction/non-conduction of MOSFET 10 at an output of the semiconductor circuit. Conduction represents the on state of MOSFET 10 and non-conduction the off state of MOSFET 10. The drive signal includes a first transition from one to the other between the H level and the L level, and a second inverse transition between the H level and the L level. For example, when the first transition is a transition from the H level to the L level, the second transition is a transition from the L level to the H level. The drive signal propagates from the input of the semiconductor circuit to the output of the semiconductor circuit, through either one of the Schottky barrier diodes D1, D2 in the semiconductor circuit. In the semiconductor circuit, the circuit changes from a first to a second of two conduction states in response to the first transition of the drive signal in propagation of the drive signal in each of the Schottky barrier diodes D1, D2, and the circuit changes from the second to the first of the two conduction states in response to the second transition of the drive signal in propagation of the drive signal in each of the two semiconductor elements, so that the semiconductor circuit has variable resistance of the semiconductor circuit to the propagation of the drive signal, whereby the signal to control conduction/non-conduction of MOSFET 10 results at the output of the semiconductor circuit according to the resistance change. The semiconductor circuit is composed of the parallel circuit in which the Schottky barrier diodes D1, D2 are connected in parallel. The Schottky barrier diodes D1, D2 are connected in directions opposite to each other and in parallel with each other. The drive signal propagates from the input of the parallel circuit to the output of the parallel circuit. The two conduction states of the semiconductor circuit are generated according to the resistance of the semiconductor circuit to the propagation of the drive signal. The resistance of the semiconductor circuit to the propagation of the drive signal is generated according to the direction of the drive signal flowing in the Schottky barrier diodes D1, D2 constituting the semiconductor circuit. Namely, the conduction state of the semiconductor circuit varies from the first to the second of the two conduction states, or from the second to the first of the two conduction states, according to change in the direction of the drive signal propagating in the semiconductor circuit.

The MOSFET 10 is an N-channel type switching element, whereas, in the case where a P-channel type switching element is used, the MOSFET 20 is used instead of the MOSFET 10. The semiconductor material of Schottky barrier diodes D1, D2 is silicon carbide. When the N-channel type MOSFET 10 is used as the switching element, the Schottky barrier diode D1 is connected in the forward direction to the MOSFET 10, the Schottky barrier diode D2 is connected in the backward direction to the MOSFET 10, and the resistance of the Schottky barrier diode D1 is larger than that of the Schottky barrier diode D2. When the P-channel type MOSFET 20 is used, the Schottky barrier diode D2 is connected in the forward direction to the MOSFET 20, the Schottky barrier diode D1 is connected in the backward direction to the MOSFET 20, and the resistance of the Schottky barrier diode D2 is larger than that of the Schottky barrier diode D1.

Next, the action and effect of Embodiment 3 will be further described. For example, in the case where the N-channel type MOSFET 10 is used as the switching element, when the drive signal output from the signal source S1 turns from the L level to the H level, the Schottky barrier diode D1 with the relatively large on-resistance becomes conducting (in this case, the Schottky barrier diode D2 is non-conducting), whereby the MOSFET 10 is gently turned on by controlling the gate current flowing to the gate electrode 13. When the drive signal output from the signal source S1 turns from the H level to the L level, the Schottky barrier diode D2 with the relatively small on-resistance becomes conducting (in this case, the Schottky barrier diode D1 is non-conducting), whereby the MOSFET 10 is quickly turned off by extracting the gate current from the gate electrode 13 by low resistance. In the case where the P-channel type MOSFET 20 is used as the switching element, the same effect is achieved as in the case using the MOSFET 10, by setting the on-resistance of the Schottky barrier diode D1 relatively small and the on-resistance of the Schottky barrier diode D2 relatively large.

Embodiment 3 will be described using still another expression. As shown in FIG. 8, the semiconductor device 1c is provided with the N-channel type MOSFET 10 as an insulated gate type switching element provided on the substrate 5a (the MOSFET 20 in the case of the P-channel type), and a semiconductor circuit having the Schottky barrier diodes D1, D2 containing the semiconductor material with the larger bandgap than silicon and provided on the substrate 5a. The Schottky barrier diodes D1, D2 constitute a parallel circuit in which they are connected in directions opposite to each other and in parallel with each other. Namely, the semiconductor circuit consists of this parallel circuit. In the case where one of the Schottky barrier diodes D1, D2 is connected in the forward direction to the MOSFET 10 and the other of the Schottky barrier diodes D1, D2 is connected in the backward direction to the switching element, the resistance of the forward Schottky barrier diode is larger than that of the backward Schottky barrier diode. The semiconductor circuit receives the drive signal having the H level (the high level) and the L level (the low level), at its input. The drive signal propagates from the input of the semiconductor circuit to the output of the semiconductor circuit through the parallel circuit. The output of the semiconductor circuit controls conduction/non-conduction of the switching element, according to the drive signal.

INDUSTRIAL APPLICABILITY

The semiconductor device is one avoiding the adverse effect of high temperatures due to the switching element and having the circuit to prevent the false firing, arranged on the same substrate as the switching element.

LIST OF REFERENCE SIGNS 1, 1a, 1b, 1c semiconductor device.
5, 5a substrate.
10, 20 MOSFET (switching element).
13, 23 gate electrode (insulated gate).
30, 40 JFET (semiconductor element).
31, 41 drain electrode.
32, 42 source electrode.
33, 43 gate electrode.
D1, D2 Schottky barrier diodes.

The invention claimed is:

1. A semiconductor device comprising:
an insulated gate type switching element and a semiconductor circuit; and
a control signal for on/off control of the switching element propagating in the semiconductor circuit,
the switching element and the semiconductor circuit being provided on a substrate,
the semiconductor circuit comprising a semiconductor element or a plurality of semiconductor elements,
the semiconductor element and the plurality of semiconductor elements containing a semiconductor with a larger bandgap than silicon, and
the semiconductor element and the plurality of semiconductor elements being configured so that resistance upon propagation of the control signal can be varied to a large/small value,
wherein the semiconductor element is an FET of an N-channel type (or a P-channel type),
wherein resistance of a channel of the semiconductor element varies to a large/small value according to a low/high level (or a high/low level) of voltage of a gate electrode with reference to a potential of a drain electrode or a source electrode,
wherein one of the source electrode and the drain electrode of the semiconductor element receives a drive signal, the drive signal having a high level and a low level, and
wherein the other of the source electrode and the drain electrode of the semiconductor element is connected to a gate electrode of the switching element,
wherein a divided voltage of the drive signal is applied to the gate electrode of the semiconductor element.

2. The semiconductor device according to claim 1, wherein the FET is a JFET or a depletion type MOSFET.

3. The semiconductor device according to claim 1, wherein the semiconductor element and the plurality of semiconductor elements contain a semiconductor material of silicon carbide.

4. A semiconductor device comprising:

an insulated gate type switching element being provided on a substrate; and a semiconductor circuit having at least one semiconductor element, the semiconductor element containing a semiconductor material with a larger bandgap than silicon and being provided on the substrate, the semiconductor circuit receiving a drive signal at an input of the semiconductor circuit and generating a signal to control conduction/non-conduction of the switching element at an output of the semiconductor circuit, the drive signal having a high level and a low level, the drive signal including a first transition from one to the other between the high level and the low level, and a second inverse transition between the high level and the low level, the drive signal propagating from the input of the semiconductor circuit to the output of the semiconductor circuit through the semiconductor element, and in the semiconductor circuit, the semiconductor element changing from a first to a second of two conduction states in response to the first transition of the drive signal in propagation of the drive signal in the semiconductor element and the semiconductor element changing from the second to the first of the two conduction states in response to the second transition of the drive signal in propagation of the drive signal in the semiconductor element, so that the semiconductor circuit has variable resistance of the semiconductor circuit to the propagation of the drive signal, whereby the signal results at the output of the semiconductor circuit according to variation in the resistance, wherein the semiconductor element has a gate electrode, a drain electrode, and a source electrode, wherein the semiconductor circuit has another input to receive a gate signal for the gate electrode of the semiconductor element, wherein the semiconductor element is an FET, wherein the FET is of one of an N-channel type and a P-channel type, and wherein in the FET, resistance of a channel of the semiconductor element varies according to the gate signal with reference to a potential of one of the drain electrode and the source electrode, wherein one of the source electrode and the drain electrode of the semiconductor element receives a drive signal, the drive signal having a high level and a low level, and wherein the other of the source electrode and the drain electrode of the semiconductor element is connected to a gate electrode of the switching element, wherein a divided voltage of the drive signal is applied to the gate electrode of the semiconductor element.

5. The semiconductor device according to claim 4, wherein the semiconductor element is of a type different from an insulated gate type.

6. The semiconductor device according to claim 4, wherein the FET is a JFET, and wherein the drive signal propagates from one of a source electrode and a drain electrode of the JFET to the other of the source electrode and the drain electrode of the JFET.

7. The semiconductor device according to claim 4, wherein the FET is a depletion type MOSFET, and wherein the drive signal propagates from one of a source electrode and a drain electrode of the MOSFET to the other of the source electrode and the drain electrode of the MOSFET.

8. The semiconductor device according to claim 4, wherein the switching element is of one of an N-channel type and a P-channel type.

9. The semiconductor device according to claim 4, wherein a semiconductor material of the semiconductor element contains silicon carbide.

10. A semiconductor device comprising:

an insulated gate type switching element being provided on a substrate; and a semiconductor circuit having one semiconductor element, the semiconductor element containing a semiconductor material with a larger bandgap than silicon and being provided on the substrate, the semiconductor element having a source electrode, a drain electrode, and a gate electrode, one of the source electrode and the drain electrode of the semiconductor element receiving a drive signal, the drive signal having a high level and a low level, the drive signal propagating from an input of the semiconductor circuit to an output of the semiconductor circuit through the semiconductor element, and the other of the source electrode and the drain electrode of the semiconductor element providing a signal to control conduction/non-conduction of the switching element according to the drive signal, and connected to a gate electrode of the switching element, wherein a divided voltage of the drive signal is applied to the gate electrode of the semiconductor element.

11. A semiconductor device comprising:

an insulated gate type switching element being provided on a substrate; and a semiconductor circuit having two semiconductor elements, the two semiconductor elements containing a semiconductor material with a larger bandgap than silicon and being provided on the substrate, the two semiconductor elements being first and second Schottky barrier diodes, respectively, the first and second Schottky barrier diodes constituting a parallel circuit, the first and second Schottky barrier diodes being connected in directions opposite to each other and in parallel with each other in the parallel circuit, the first Schottky barrier diode being connected in a forward direction to the switching element, the second Schottky barrier diode being connected in a backward direction to the switching element, resistance of the first Schottky barrier diode being larger than resistance of the second Schottky barrier diode, the semiconductor circuit receiving a drive signal at an input thereof, the drive signal having a high level and a low level, the drive signal propagating from the input of the semiconductor circuit to an output of the semiconductor circuit through the parallel circuit, and the output of the semiconductor circuit providing a signal to control conduction/non-conduction of the switching element according to the drive signal.

12. A semiconductor device comprising:
an insulated gate type switching element and a semiconductor circuit; and
a control signal for on/off control of the switching element propagating in the semiconductor circuit,
the switching element and the semiconductor circuit being provided on a substrate,
the semiconductor circuit comprising a semiconductor element or a plurality of semiconductor elements,
the semiconductor element and the plurality of semiconductor elements containing a semiconductor with a larger bandgap than silicon, and
the semiconductor element and the plurality of semiconductor elements being configured so that resistance upon propagation of the control signal can be varied to a large/small value,
wherein the switching element is of an N-channel type (or a P-channel type), and
wherein the semiconductor elements are Schottky barrier diodes connected in antiparallel connection, and resistance in a forward direction (or a backward direction) to the switching element is set larger than resistance in a backward direction (or a forward direction) to the switching element.

13. A semiconductor device comprising:
an insulated gate type switching element being provided on a substrate; and
a semiconductor circuit having at least one semiconductor element,
the semiconductor element containing a semiconductor material with a larger bandgap than silicon and being provided on the substrate,
the semiconductor circuit receiving a drive signal at an input of the semiconductor circuit and generating a signal to control conduction/non-conduction of the switching element at an output of the semiconductor circuit,
the drive signal having a high level and a low level,
the drive signal including a first transition from one to the other between the high level and the low level, and a second inverse transition between the high level and the low level,
the drive signal propagating from the input of the semiconductor circuit to the output of the semiconductor circuit through the semiconductor element, and
in the semiconductor circuit, the semiconductor element changing from a first to a second of two conduction states in response to the first transition of the drive signal in propagation of the drive signal in the semiconductor element and the semiconductor element changing from the second to the first of the two conduction states in response to the second transition of the drive signal in propagation of the drive signal in the semiconductor element, so that the semiconductor circuit has variable resistance of the semiconductor circuit to the propagation of the drive signal, whereby the signal results at the output of the semiconductor circuit according to variation in the resistance,
wherein the semiconductor circuit further has another semiconductor element, and is constituted by a parallel circuit,
wherein in the parallel circuit, the semiconductor element and the other semiconductor element are connected in parallel,
wherein the semiconductor element and the other semiconductor element are first and second Schottky barrier diodes, respectively,
wherein the first and second Schottky barrier diodes are connected in directions opposite to each other and in parallel with each other,
wherein the drive signal propagates from an input of the parallel circuit to an output of the parallel circuit, and
wherein when the first Schottky barrier diode is connected in a forward direction to the switching element and the second Schottky barrier diode is connected in a backward direction to the switching element, resistance of the first Schottky barrier diode is larger than resistance of the second Schottky barrier diode.

* * * * *